United States Patent [19]

Ishiguro et al.

[11] 4,035,612

[45] July 12, 1977

[54] CIRCUIT FOR DETECTING TROUBLE IN ELECTRIC LINES CONNECTING RELATIVELY MOVABLE CIRCUITS

[75] Inventors: Tutomu Ishiguro; Yukio Katano, both of Kawaguchi, Japan

[73] Assignee: Kabushiki Kaisha KIP, Japan

[21] Appl. No.: 590,808

[22] Filed: June 27, 1975

[30] Foreign Application Priority Data

July 18, 1974 Japan ............................. 49-82427

[51] Int. Cl.² .......................................... H05B 1/02
[52] U.S. Cl. ............................... 219/469; 219/471
[58] Field of Search ......... 219/216, 469, 471, 494, 219/497, 499, 501, 504, 505; 317/146; 340/253 R, 256; 324/51

[56] References Cited

U.S. PATENT DOCUMENTS

| | | | |
|---|---|---|---|
| 3,484,581 | 12/1969 | Bliss | 219/469 |
| 3,588,445 | 6/1971 | Hopkins | 219/469 |
| 3,697,726 | 10/1972 | Geronime | 219/469 |
| 3,742,191 | 6/1973 | Poole | 219/469 X |

*Primary Examiner*—Bruce A. Reynolds
*Assistant Examiner*—Fred E. Bell
*Attorney, Agent, or Firm*—Bosworth, Sessions & McCoy

[57] ABSTRACT

A circuit for detecting trouble in a sliding contact mechanism comprising a fixed contact portion and a movable contact portion, said fixed portion being connected to an electric power source.

A radio-frequency signal is generated when insufficient electrical connection is caused in the sliding contact mechanism by, for example, depositing dusts thereon, said signal being delivered to a suitable alarm device to indicate the troublesome state.

3 Claims, 3 Drawing Figures

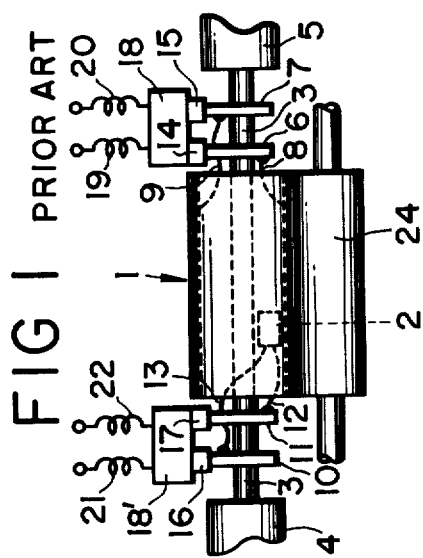
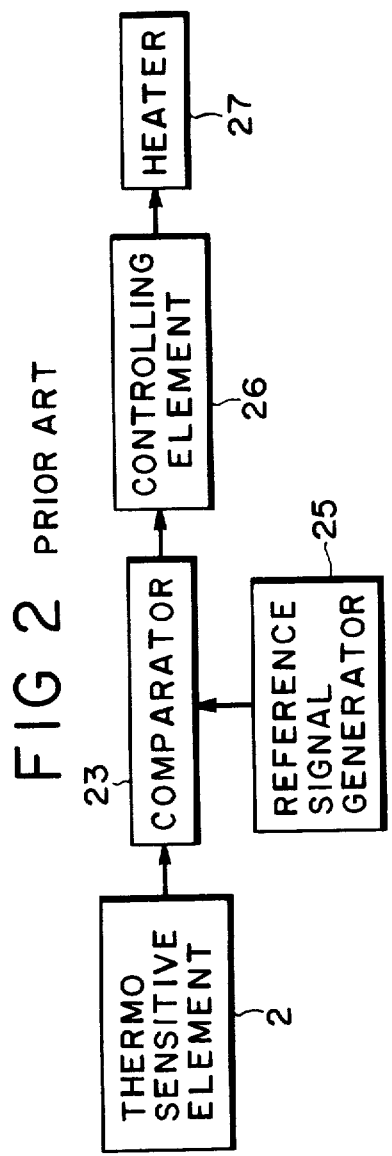

CIRCUIT FOR DETECTING TROUBLE IN ELECTRIC LINES CONNECTING RELATIVELY MOVABLE CIRCUITS

BACKGROUND OF THE INVENTION

1. Field of the Invention

The present invention relates to a circuit for detecting a trouble in electric lines connecting relatively movable circuits, and more particularly to a circuit for detecting insufficient electrical connection in a sliding contact mechanism connecting an external circuit disposed on a fixed construction to a circuit carried by a relatively movable body.

2. Description of the Prior Art

An electrical apparatus including a body movable relative to a fixed construction has a wide range of application. In such an apparatus, electrical connection or connections are made through sliding contact mechanisms, such as ring and brush mechanisms, for supplying electric power to an electric circuit provided on the movable body or for deriving signals therefrom to an external electric circuit disposed on the fixed construction.

Since such a sliding contact mechanism often causes such troubles as defective or insufficient contact or incapability of power supply which may result in a grave adverse effect on the electrical apparatus, it is required that the trouble be immediately detected and a suitable countermeasure taken.

As an example of the electrical apparatus, an electrophotographic copying apparatus is known in which electric power is supplied through a sliding contact mechanism to a heater element carried by a rotatable heating roller in the fixing section of the apparatus to heat up the roller and, at the same time, electric signals are also supplied from a thermosensitive element also carried by the roller through a further sliding contact mechanism to an external circuit for detecting the temperature condition of the roller. The present invention can be applied to such an electric control circuit having a sliding contact mechanism, and in particular to an improved temperature control circuit for preventing overheating of the heating roller of such a copying apparatus.

As is generally known, the electrophotographic copying apparatus has an electrostatic-latent-image-forming section, a developing section and a fixing section for heating and fixing a toner image formed on a sheet of paper to provide a desired picture. There are two types of heating devices, that is, an oven type device and a heating roller type device, for use in the fixing section of the copying apparatus. In the oven type device, an electric heater disposed near a sheet of paper fed from the developing section serves to heat and melt the toner to fix it on the paper. In this type of device, the heater and the paper do not contact each other, and the heating of the toner is made by heat radiated from the electric heater. It is therefore necessary that the temperature of the heater be cosiderably higher than that sufficient for melting the toner, and hence a relatively wide range of temperature is permitted. This makes the temperature control of the heater easier. However, the oven type device has the disadvantages that the fixing section consumes a large amount of electric power and that there is always a danger of fire because of the high temperature of the heater.

The fixing section provided with the heating roller type device eliminates such disadvantages. This type of device is arranged such that a toner-bearing paper passes through the nip between a heating roller heated at a predetermined temperature and a pressing roller to fix the toner image to the paper by directly contacting the paper with the heating roller. With this arrangement, the heating roller type device has the advantage that the thermal efficiency is very high and hence the power consumption is very low. However, it has the disadvantage that the allowable range of temperature is very narrow, so that when the temperature of the heating roller deviates from this range, such adverse effects as insufficient or defective fixing or the offset phenomenon may occur.

In view of this, the conventional heating roller type device is provided with a temperature control circuit having a thermosensitive element to control the temperature of the heating roller always within a predetermined range. The heater and the thermosensitive element are provided inside the heating roller which constitutes a rotating body, so that electrical connections between them and external circuits are effected by means of sliding contact mechanisms each of which comprises an electrically conductive fixed brush and an electrically conductive ring rotatable relative thereto in sliding contact therewith. Such an electrical connection is preferable in that the structure is simple. However, it has the disadvantage that insufficient contact between the brush and the ring is apt to occur owing to the wear of the brush, dust lying between them, or the like. In particular, when the signal from the thermosensitive element is interrupted by the insufficient contact with the result that the electric control is impaired, the heater becomes overheated. As a result, the offset phenomenon, in which the toner is stuck on the heating roller occurs, producing an unsatisfactory picture and in the worst case a fire may be caused.

SUMMARY OF THE INVENTION

It is an object of the present invention to provide, in a simple and convenient form, a circuit for detecting an insufficient connection in an electric line including relatively movable contacts.

BRIEF DESCRIPTION OF THE DRAWINGS

FIG. 1 is a fragmentary schematic illustration of a heating roller type fixing device for an electrophotographic copying apparatus.

FIG. 2 is a block diagram of a conventional circuit for controlling the temperature of the heating roller of FIG. 1.

DESCRIPTION OF THE PREFERRED EMBODIMENTS

Figure 3:
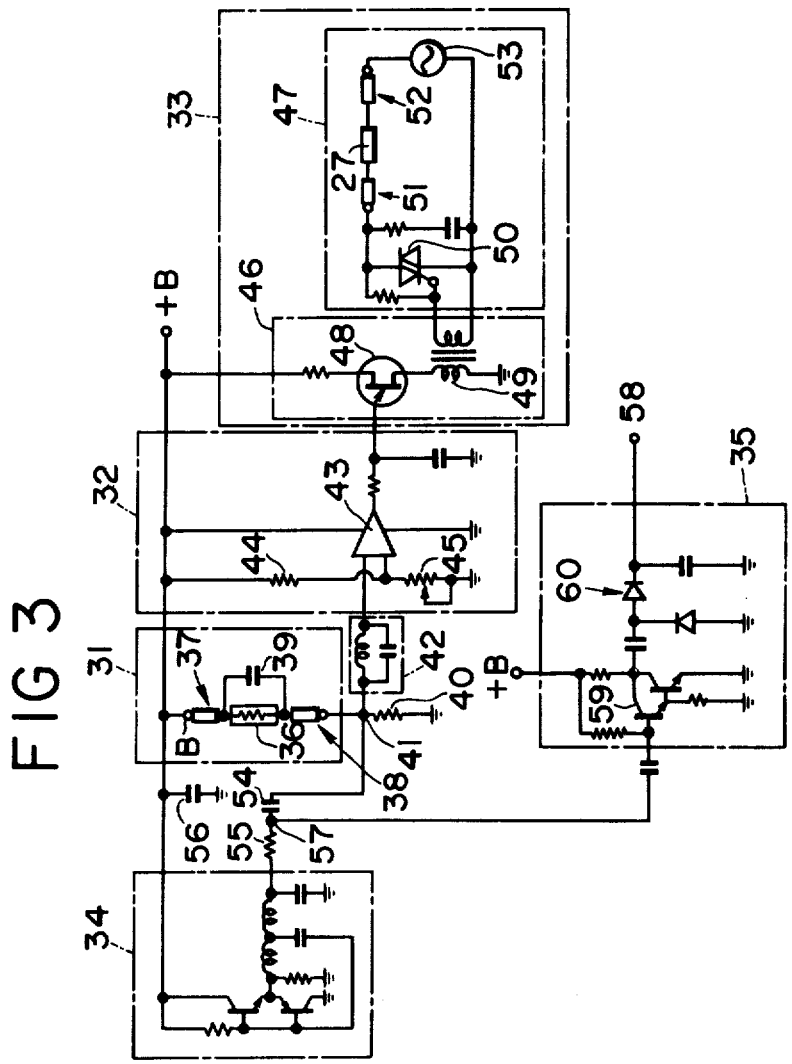
FIG. 3 shows a preferred embodiment of the trouble detecting circuit according to the present invention.

Referring first to FIG. 1, there is shown a heating roller type fixing device for an electrophotographic copying apparatus to which the present invention is applied. The fixing device is provided with a hollow cylindrical heating roller generally designated by 1 and which includes a hollow cylinder made of a rigid material, such as metal, a resilient layer, such as a silicone impregnated rubber layer, adhered to the substantially entire area of an outer surface of the cylinder, and an electric heater fixed to an inner surface of the cylinder to provide substantially uniform heating of the entire cylinder and thus the resilient layer by energizing the heater as will be described hereinunder in more detail. The electric heater may be a conventional one, such as, for example, a flexible heating element commercially sold under the trade name of "FLEXIBLE HEATER" by the Electro-Flex Co., Ltd. (U.S.A.). The roller 1 is provided with a thermosensitive element 2, such as a thermistor or thermocouple, attached to but electrically insulated from the heater for generating electric signals in accordance with changes in the temperature of the roller. It is preferable that the roller 1 is also provided at its opposite ends with end plates (not shown) to close the ends thereof for minimizing the heat losses of the heater and preventing foreign matter from entering into the inner space of the roller.

A shaft 3 coaxially extends through the roller 1 and is secured to the end plates thereof, opposite end portions of the shaft projecting outwardly from the respective end plates. The shaft 3 is rotatably supported by bearings 4 and 5 and can be rotated by a suitable driving means (not shown) at an appropriate speed of rotation. A pair of annular, electrically conductive rings 6 and 7 are secured by suitable insulating means (not shown) to one of the exposed end portions of the shaft 3, the rings being axially spaced from each other and being electrically connected by lead wires 8 and 9 to terminals, respectively, of the electric heater of the roller 1. Similarly, another pair of annular, electrically conductive rings 10 and 11 are secured by similar insulating means to the other exposed end portion of the shaft 3, the rings 10, 11 being axially spaced from each other and being electrically connected by lead wires 12 and 13 to terminals, respectively, of the thermosensitive element 2.

Two pairs of electrically conductive brushes 14, 15 and 16, 17 are slidably supported by electrically insulating members 18, 18' secured to a fixed construction of the fixing device. Each of the brushes 14, 15, 16 and 17 is urged by a suitable resilient means (not shown) towards the periphery of each of the rings 6, 7, 10 and 11 so that free end of each of the brushes contacts the periphery of such a ring to provide a sliding contact mechanism for making an electrical connection therebetween. The brushes 14 and 15 are electrically connected by lead wires 19 and 20 to output terminals, respectively, of an electric source provided in the copying apparatus in which the fixing device is disposed. The brushes 16 and 17 are connected by lead wires 21 and 22 to input terminals, respectively, of an associated comparator 23 which is diagrammatically shown in FIG. 2. It will be appreciated that an electric circuit is made between the electric source and the electric heater through the wires 8, 9, the rings 6, 7, the brushes 14, 15 and the wires 19, 20 so that electric power is supplied from the source to the electric heater to energize the latter to heat the roller 1 to a predetermined temperature. It will also be understood that a further electric circuit is made between the thermosensitive element 2 and the comparator 23 through the wires 12, 13, the rings 10, 11, the brushes 16, 17 and the wires 21, 22 to supply electric signals from the element 2 to the comparator 23, the signals having magnitudes varying in accordance with changes in the temperature of the roller 1.

The outer periphery of the resilient layer of the roller 1 is in frictional contact with a pressing roller 24 disposed in parallel with the roller 1 so that the pressing roller is driven to be angularly moved without relative slipping movement therebetween. In use, a copying paper which has passed through a developing station of the copying apparatus is fed to the nip between the rollers 1 and 24, the surface of the paper on which the toner image is carried is brought into contact with the roller 1, and during the passage of the paper through the nip the toner image is fixed to the paper by heat from the roller 1.

As shown in FIG. 2, the comparator 23 is also supplied with a reference signal from a reference signal generator 25 to compare the magnitude of the signal from the element 2 with that of the reference signal thereby generating an output signal in accordance with the difference between the magnitudes of the two signals supplied to the comparator. The output signal of the comparator is supplied to a control element 26 which in turn controls the current supplied to an electric heater 27 such as is described hereinabove, thereby maintaining the temperature thereof at a substantially constant value.

FIG. 3 shows a circuit according to the present invention for controlling the temperature of the heating roller of the fixing device shown in FIG. 1. The circuit comprises a temperature detecting circuit 31, a comparator circuit 32, a heater current controlling circuit 33, a radio-frequency oscillating circuit 34 and a signal generating circuit 35. The temperature detecting circuit 31 includes a thermosensitive element 36, such as a thermistor, fixed inside the heating roller as described. The element 36 is connected to an outer circuit through sliding contact mechanisms 37 and 38 which comprise the rings 10, 11 and the brushes 16, 17 shown in FIG. 1. Also provided in the heating roller is a capacitor 39 which is connected across the thermosensitive element 36. A resistor 40 is connected to the thermosensitive element 36 through the sliding contact mechanism 38 to form a voltage dividing circuit. Since the thermosensitive element 36 decreases in its resistance as the temperature rises as is well known, the voltage level at a junction point 41 between the temperature detecting circuit 31 and the resistor 40 rises with changes in the temperature of the heating roller. The voltage level at the junction point 41 is applied through a wave trapping circuit 42 to one of the input terminals of a differential amplifier 43 in the comparator circuit 32. The other input terminal of the amplifier 43 is at a reference voltage level preset by a resistor 44 and a variable resistor 45, so that the amplifier 43 can compare the temperature of the heating roller detected by the temperature detecting circuit 31 with a predetermined value. With the temperature variation of the heating roller, the control signals from the comparator circuit 32 are supplied to the heater current control circuit 33 which includes a gate pulse generating circuit 46 and a phase control circuit 47. The control signals from the comparator circuit 32 are supplied to the gate terminal of a uni-junction transistor 48 in the gate pulse generating circuit 46 to cause the transistor 48 and a pulse transformer 49 to produce gate pulses as is well known. The gate pulses are supplied to the gate terminal of a bi-directional thyristor 50 in the phase control circuit 47 to control its turn-on phase, and the thyristor 50 may be a conventional one sold, for example, under the trade name of "TRIAC" by General Electric Co., Ltd. (U.S.A.). Since the thyristor 50 forms a series circuit together with a sliding contact mechanism 51, the heater 27 of the heating roller, a sliding contact mechanism 52 and a power source 53, the current passing through the heater 27 is controlled by the temperature of the heating roller. Thus, it is apparent that the temperature of the heating roller is controlled within a desired temperature range. The sliding contact mechanisms 51, 52 are respectively constituted by the rings 6, 7 and the brushes 14, 15 shown in FIG. 1.

The aforementioned junction point 41 is connected to the output terminal of the radio-frequency oscillating circuit 34 through a capacitor 54 and a resistor 55. The oscillating circuit 34 may be any one of various types and in this embodiment it oscillates at a frequency of 80 KHz. It is important that the output of the oscillating circuit 34 is AC grounded through the resistor 55, the capacitor 54, the temperature detecting circuit 31 and a by-pass capacitor 56.

Consider now that the sliding contact mechanisms 37, 38 are in normal condition to transmit the signal from the thermosensitive element 36. Since the heating roller is at a high temperature in the operating state of the copying apparatus, the resistance of the thermosensitive element 36 is lower than the impedance of the impedance element 55 at the output frequency of the oscillator 34. As a result, the output of the oscillator circuit 34 is substantially grounded through the path consisting of the sliding contact mechanism 38, the thermosensitive element 36, the sliding contact mechanism 37 and the by-pass capacitor 56. Thus, it is understood that the output of the oscillating circuit 34 is not produced at a junction point 57. Consequently, no input signal is supplied to the signal generating circuit 35, so that no signal is generated at its output terminal 58.

In the event that insufficient contact condition is caused in one or both of the sliding contact mechanisms 37, 38 thereby cutting off the grounding path of the output of the oscillating circuit 34, a radio-frequency signal of 80 KHz appears at the junction point 57, which is supplied to the input terminal of the signal generating circuit 35 including a Darlington connected AC amplifier 59 and a rectifying integrating circuit 60. The circuit 35 produces a DC signal at its output terminal 58 and the DC signal is supplied to a suitable alarm device (not shown) to indicate the troublesome state of the fixing device or to interrupt the operation of the copying apparatus.

As described above, according to the present invention, the output signals of the radio-frequency oscillating circuit 34 are by-passed or shunted through the sliding contact mechanisms and therefore supplied to the signal generating circuit 35 in the normal condition of the sliding contact mechanisms, whereas in the troublesome or out-of-order condition of the sliding contact mechanism or mechanisms the signal is immediately supplied to the signal generating circuit to prevent the troublesome state of the fixing device from continuing.

The temperature control of the heating roller in the operating state of the fixing device is apparent from the above description. However, the situation is somewhat different when the heating roller is not yet fully heated up as at the starting time of the fixing device and thus the copying apparatus. In such an insufficiently heated state of the heating roller, the resistance of the thermosensitive element 36 is much higher than or of the same order as the impedance of the impedance element 55 at the output frequency of the oscillator. In this case, the output of the oscillating circuit 34 may not be completely by-passed or shunted to the ground. This results in the inconvenience that the alarm device may be operated at the starting time of the fixing device thereby interrupting the operation of the copying apparatus, for example. Such an inconvenience should be prevented by rendering the oscillating circuit 34 not operated until the temperature of the heating roller reaches a predetermined value. For this purpose, it is very effective to connect the capacitor 39 across the thermosensitive element 36 as shown in FIG. 3.

Though the capacitor 39 hardly affects the DC temperature detecting action of the temperature detecting circuit 31, it provides a low impedance by-pass for the radio-frequency output of the oscillating circuit 34. Consequently, even if the heating roller of the copying apparatus is in the lower temperature state and hence the thermosensitive element 36 is at its high resistance, the output of the oscillating circuit 34 is effectively by-passed to ground through the capacitor 39. Thus, the insufficient contact condition of the sliding contact mechanism can always be detected by connecting a simple capacitor.

We claim:
1. A circuit for controlling the temperature of a heating roller in an electrophotographic copying machine comprising a temperature detecting element fixed to the heating roller, a sliding contact electrically connecting said temperature detecting element to a stationary circuit, a high frequency oscillator having its output connected to said sliding contact, a capacitor in circuit with said sliding contact for passing the output signal of said oscillator to ground through said sliding contact, and a signal generator connected to the output of said high frequency oscillator for producing a signal indicating imperfect operation of said sliding contact.

2. A control circuit according to claim 1, further comprising a comparator circuit for comparing an output signal of the temperature detecting element with a reference signal, and a controller for regulating the current flowing through the heating roller in response to the output signal of the comparator circuit.

3. A control circuit according to claim 1, further comprising a capacitor connected across the temperature detecting element to provide a branch circuit for the high frequency signal from the high frequency oscillator.

* * * * *